(12) United States Patent
Oh

(10) Patent No.: US 10,002,853 B2
(45) Date of Patent: Jun. 19, 2018

(54) STACKED SEMICONDUCTOR PACKAGE HAVING A SUPPORT AND METHOD FOR FABRICATING THE SAME

(71) Applicant: SAMSUNG ELECTRONICS CO., LTD., Suwon-si, Gyeonggi-do (KR)

(72) Inventor: Joo Young Oh, Asan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/423,725

(22) Filed: Feb. 3, 2017

(65) Prior Publication Data

US 2018/0005994 A1 Jan. 4, 2018

(30) Foreign Application Priority Data

Jul. 4, 2016 (KR) .................. 10-2016-0083911

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/0651* (2013.01); *H01L 2225/06517* (2013.01); *H01L 2225/06562* (2013.01)

(58) Field of Classification Search
CPC ....... H01L 23/48; H01L 25/065; H01L 25/50; H01L 23/3128; H01L 24/16; H01L 24/29; H01L 24/32; H01L 24/45; H01L 24/73; H01L 25/18

USPC ....... 257/777, 723, 686, 685, 738, 737, 734, 257/778
See application file for complete search history.

(56) References Cited

U.S. PATENT DOCUMENTS

| 7,732,831 B2 * | 6/2010 | Takeuchi ............ H01L 33/0079 257/103 |
| 7,732,908 B2 | 6/2010 | Nishiyama et al. |
| 7,944,037 B2 | 5/2011 | Nishiyama et al. |
| 7,989,941 B2 | 8/2011 | Chin et al. |

(Continued)

FOREIGN PATENT DOCUMENTS

| JP | 4498403 | 7/2010 |
| KR | 10-2013-0024567 | 3/2013 |

(Continued)

*Primary Examiner* — Alexander Oscar Williams
(74) *Attorney, Agent, or Firm* — F. Chau & Associates, LLC

(57) ABSTRACT

A semiconductor package includes a substrate, and a first semiconductor chip stack disposed on the substrate. The first semiconductor chip stack includes a plurality of first semiconductor chips. The first semiconductor chips are stacked in a staircase configuration along a first direction. A first support is disposed on the substrate. The first support is spaced apart from the first semiconductor chip stack. A second semiconductor chip stack is disposed on the first semiconductor chip stack and the first support. The second semiconductor chip stack includes a plurality of second semiconductor chips. The second semiconductor chips are stacked in a second staircase configuration along a second direction opposite the first direction. A height of the first semiconductor chip stack is substantially equal to a height of the first support.

19 Claims, 13 Drawing Sheets

(56) References Cited

U.S. PATENT DOCUMENTS

| | | |
|---|---|---|
| 8,035,210 B2 | 10/2011 | Yang et al. |
| 8,178,978 B2 | 5/2012 | McElrea et al. |
| 8,557,635 B2 * | 10/2013 | Omizo .................. H01L 24/83 |
| | | 438/107 |
| 8,674,494 B2 * | 3/2014 | Nam ..................... H01L 24/97 |
| | | 257/686 |
| 9,412,720 B2 | 8/2016 | Nam et al. |
| 9,412,722 B1 * | 8/2016 | Lin ................... H01L 25/0657 |
| 2005/0104183 A1 * | 5/2005 | Kuroda ................. H01L 25/18 |
| | | 257/686 |
| 2007/0218588 A1 | 9/2007 | Takiar et al. |
| 2008/0174000 A1 * | 7/2008 | Chen ................ H01L 23/49575 |
| | | 257/686 |
| 2008/0174030 A1 * | 7/2008 | Liu ....................... H01L 24/32 |
| | | 257/777 |
| 2008/0176358 A1 * | 7/2008 | Liu ....................... H01L 24/32 |
| | | 438/109 |
| 2009/0166887 A1 * | 7/2009 | Upadhyayula ........ H01L 21/561 |
| | | 257/777 |
| 2010/0314740 A1 * | 12/2010 | Choi ................... H01L 23/3121 |
| | | 257/686 |
| 2011/0175222 A1 * | 7/2011 | Kim ...................... H01L 23/16 |
| | | 257/738 |
| 2012/0292787 A1 * | 11/2012 | Nam ...................... H01L 23/13 |
| | | 257/777 |
| 2013/0062782 A1 * | 3/2013 | Yoshimura .............. H01L 24/75 |
| | | 257/777 |
| 2013/0161788 A1 * | 6/2013 | Chun ..................... H01L 24/05 |
| | | 257/532 |
| 2013/0277831 A1 * | 10/2013 | Yoon ................. H01L 23/49811 |
| | | 257/737 |
| 2014/0175638 A1 * | 6/2014 | Kim ..................... H01L 21/6836 |
| | | 257/737 |
| 2015/0061157 A1 * | 3/2015 | Yu ........................... H01L 25/50 |
| | | 257/777 |
| 2015/0221624 A1 * | 8/2015 | Ye ........................... H01L 25/00 |
| | | 257/777 |
| 2015/0228621 A1 * | 8/2015 | Kumar ................ H01L 25/0657 |
| | | 257/777 |
| 2015/0279787 A1 * | 10/2015 | Kim ...................... H01L 23/544 |
| | | 257/777 |
| 2016/0071810 A1 * | 3/2016 | Park ....................... H01L 23/58 |
| | | 257/723 |
| 2016/0086921 A1 | 3/2016 | Cho |
| 2016/0276312 A1 * | 9/2016 | Shimizu ............ H01L 23/49575 |

FOREIGN PATENT DOCUMENTS

| | | |
|---|---|---|
| KR | 10-1567944 | 11/2015 |
| KR | 10-2016-0034113 | 3/2016 |

* cited by examiner

STACKED SEMICONDUCTOR PACKAGE HAVING A SUPPORT AND METHOD FOR FABRICATING THE SAME

CROSS-REFERENCE TO RELATED APPLICATION

This application claims priority under 35 USC § 119 to Korean Patent Application No. 10-2016-0083911 filed on Jul. 4, 2016 in the Korean Intellectual Property Office, the disclosure of which is incorporated by reference herein in its entirety.

1. Technical Field

Exemplary embodiments of the present inventive concept relate to a semiconductor package, and more particularly to a method for fabricating the same.

2. Discussion of Related Art

Semiconductor devices include relatively high-integration and relatively high-speed semiconductor devices. In relatively high-integration semiconductor packages, a plurality of semiconductor chips may be stacked vertically.

SUMMARY

An exemplary embodiment of the present inventive concept provides a semiconductor package including a support, which may reduce deflection of a semiconductor chip stack while achieving size reduction in semiconductor package, and a method for fabricating the same.

An exemplary embodiment of the present inventive concept provides a method of manufacturing a semiconductor package in which wire bonding can be performed substantially simultaneously on upper and lower semiconductor chip stacks.

According to an exemplary embodiment of the present inventive concept, a semiconductor package includes a substrate, and a first semiconductor chip stack disposed on the substrate. The first semiconductor chip stack includes a plurality of first semiconductor chips. The first semiconductor chips are stacked in a staircase configuration along a first direction. A first support is disposed on the substrate. The first support is spaced apart from the first semiconductor chip stack. A second semiconductor chip stack is disposed on the first semiconductor chip stack and the first support. The second semiconductor chip stack includes a plurality of second semiconductor chips. The second semiconductor chips are stacked in a second staircase configuration along a second direction opposite the first direction. A height of the first semiconductor chip stack is substantially equal to a height of the first support.

According to an exemplary embodiment of the present inventive concept, a semiconductor package includes a substrate, and a first semiconductor chip stack disposed on the substrate. The first semiconductor chip stack includes a first and second semiconductor chips stacked sequentially. The semiconductor package includes a second semiconductor chip stack. A first portion of the second semiconductor chip stack is disposed on the first semiconductor chip stack, and second portion of the second semiconductor chip stack not disposed on the first semiconductor chip stack overhangs the substrate. The second semiconductor chip stack includes third and fourth semiconductor chips stacked sequentially. A support supports the second portion of the second semiconductor chip stack overhanging the substrate. Each of the first and second semiconductor chips includes a first semiconductor chip pad disposed on an upper surface of each of the first and second semiconductor chips adjacent to a first side of the first semiconductor chip stack. Each of the third and fourth semiconductor chips includes a second semiconductor chip pad disposed on an upper surface of each of the third and fourth semiconductor chips adjacent to a second side of the second semiconductor chip stack opposite the first side of the first semiconductor chip stack. The second semiconductor chip is disposed on the first semiconductor chip to expose the first pad of the first semiconductor chip. The fourth semiconductor chip is disposed on the third semiconductor chip to expose the second pad of the third semiconductor chip. The fourth semiconductor chip exposes the first semiconductor chip pad on the second semiconductor chip.

BRIEF DESCRIPTION OF THE DRAWINGS

The above and other features of the present inventive concept will become more apparent by describing in detail exemplary embodiments thereof with reference to the attached drawings, in which.

DETAILED DESCRIPTION OF THE EMBODIMENTS

Aspects of the present inventive concept and methods of accomplishing the same will be described in more detail below with reference to the accompanying drawings, in which some exemplary embodiments are shown. The present inventive concept may, however, be embodied in many different forms and should not be construed as being limited to the embodiments set forth herein.

A semiconductor package according to one or more exemplary embodiments of the present inventive concept will be described in more detail below with reference to FIGS. 1 to 6.

Figure 1:
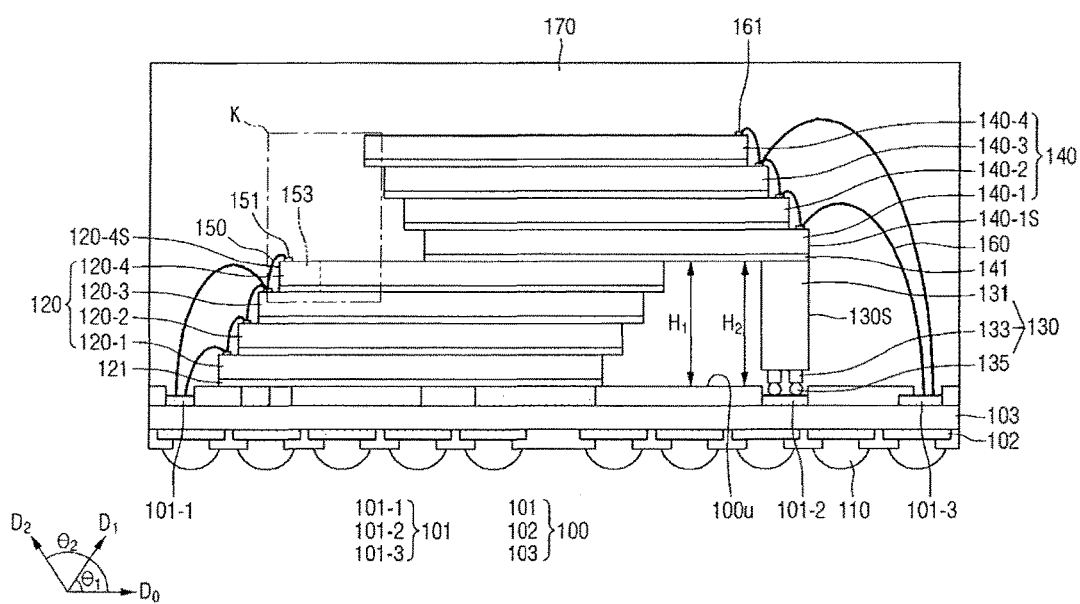
FIG. 1 is a cross-sectional view illustrating a semiconductor package according to an exemplary embodiment of the present inventive concept.
Figure 2:
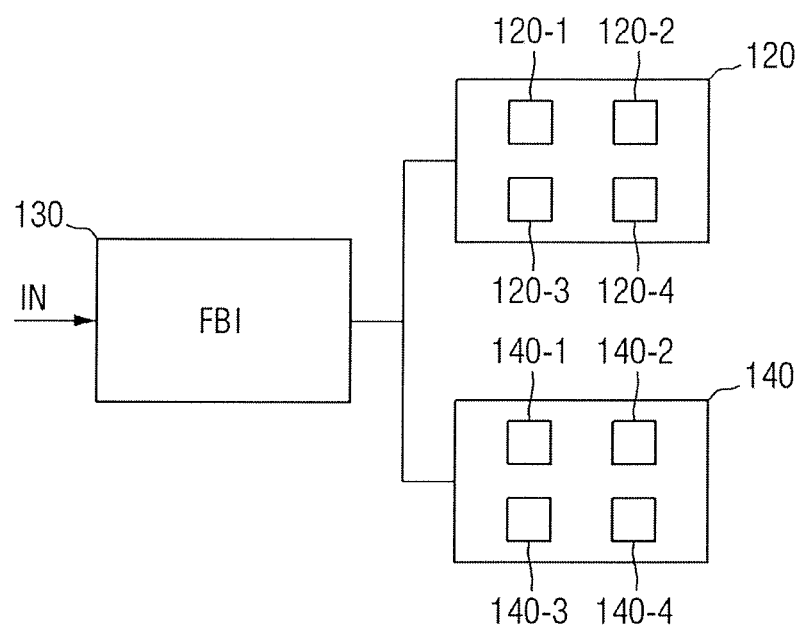
FIG. 2 is a block diagram illustrating the semiconductor package of FIG. 1.
Figure 3:
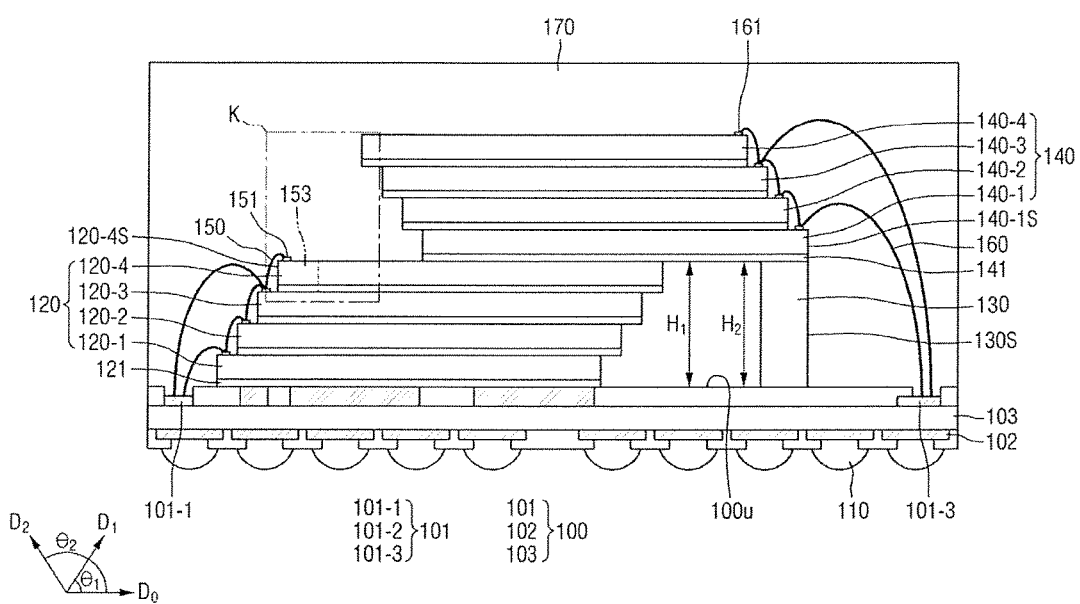
FIGS. 3 to 5 are cross-sectional views illustrating a semiconductor package according to an exemplary embodiment of the present inventive concept.
Figure 4:
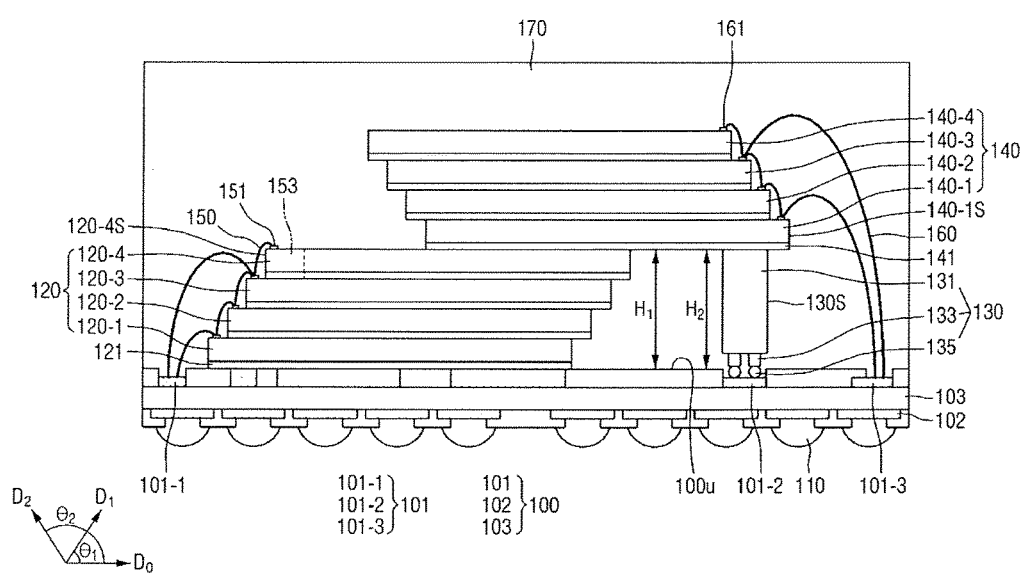
Figure 5:
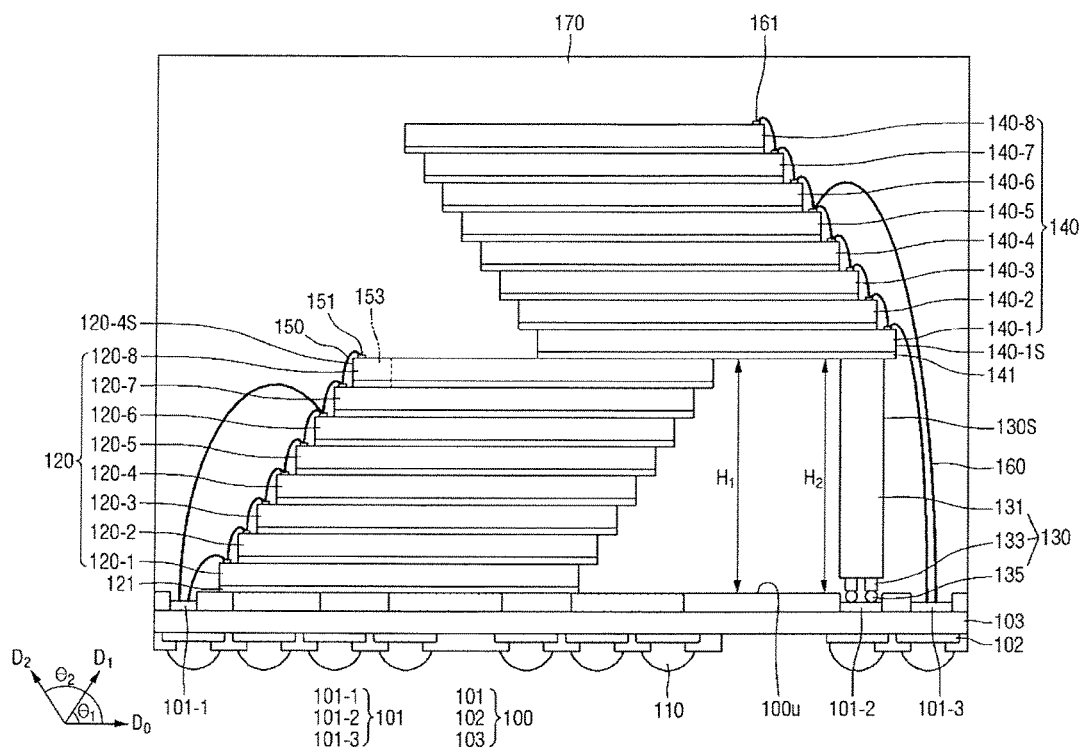
Figure 6:
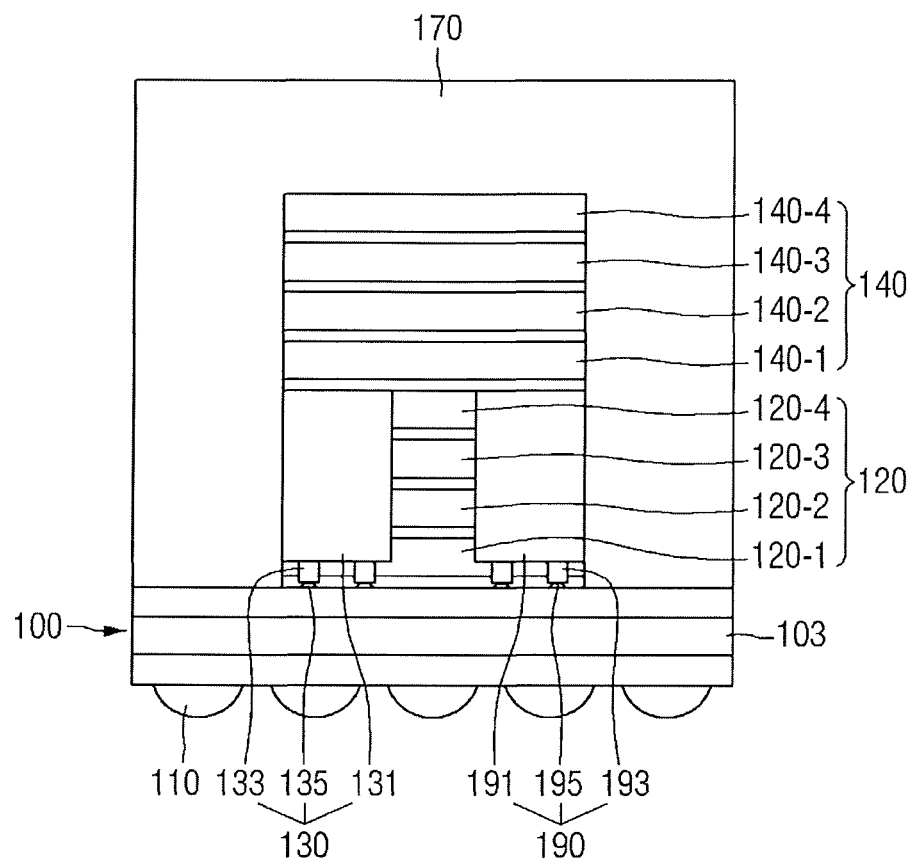
FIG. 6 is a side view of the semiconductor package of FIG. 1.

FIG. 1 is a cross-sectional view illustrating a semiconductor package according to an exemplary embodiment of the present inventive concept. FIG. 2 is a block diagram illustrating the semiconductor package of FIG. 1. FIGS. 3 to 5 are cross-sectional views illustrating a semiconductor package according to an exemplary embodiment of the present inventive concept FIG. 2 is a block diagram illustrating the semiconductor package of FIG. 1. FIG. 6 is a side view of the semiconductor package of FIG. 1.

Referring to FIG. 1, a first semiconductor chip stack 120, a second semiconductor chip stack 140, and a first support 130 may be disposed on a substrate 100.

The substrate 100 may be a substrate for a semiconductor package. The substrate 100 may be, for example, a printed circuit board (PCB), a lead frame (LF), a ceramic substrate, a silicon wafer or a wiring board. The printed circuit board may include a rigid printed circuit board (Rigid PCB), a flexible printed circuit board (Flexible PCB), or a rigid flexible printed circuit board (Rigid Flexible PCB).

The substrate 100 may include a core board 103, a lower finger pad 102, and an upper finger pad 101.

The upper finger pad 101 may be disposed on the core board 103. The upper finger pad 101 may include a first upper finger pad 101-1, a second upper finger pad 101-2 and a third upper finger pad 101-3. The upper finger pad 101 may electrically connect the components disposed on the substrate 100 with the substrate 100. For example, the upper finger pad 101 may be connected to the elements disposed on the substrate 100 through a connection.

The first upper finger pad 101-1 may electrically connect the first semiconductor chip stack 120 with the substrate 100. A first connection 150 may be electrically connected to the first upper finger pad 101-1.

The second upper finger pad 101-2 may electrically connect the first support 130 with the substrate 100. A second connection 135 may be directly connected to the second upper finger pad 101-2.

The third upper finger pad 101-3 may electrically connect the second semiconductor chip stack 140 with the substrate 100. A third connection 160 may be electrically connected to the third upper finger pad 101-3.

The lower finger pad 102 may be disposed below the core board 103. The lower finger pad 102 may be electrically connected to an external terminal 110. The lower finger pad 102 may electrically connect the external terminal 110 with the substrate 100.

Each of the upper finger pad 101 and the lower finger pad 102 may include a predetermined number of finger pads; however, exemplary embodiments of the present invention are not limited thereto.

The upper finger pad 101 and the lower finger pad 102 may each include a conductive material. The upper finger pad 101 and the lower finger pad 102 may each include, for example, gold (Au), silver (Ag), copper (Cu), nickel (Ni) or aluminum (Al).

The external terminal 110 may be electrically connected to the substrate 100 and may be disposed on a lower surface of the substrate 100. The external terminal 110 may be electrically connected to, for example, the lower finger pad 102. The external terminal 110 may be in direct contact with, for example, the lower finger pad 102.

The external terminal 110 may electrically connect a semiconductor package including the substrate 100 with another semiconductor package.

The external terminal 110 may be a solder ball; however, exemplary embodiments of the present invention are not limited thereto. For example, the external terminal 110 may be a solder bump, a grid array, or a conductive tab.

The external terminal 110 may include a plurality of external terminals disposed on the lower surface of the substrate 100.

The semiconductor chip stack may be disposed on the substrate 100. The semiconductor chip stack may include the first semiconductor chip stack 120 and the second semiconductor chip stack 140 disposed on the first semiconductor chip stack 120.

The first semiconductor chip stack 120 may be disposed on the substrate 100. The first semiconductor chip stack 120 may include a plurality of first semiconductor chips 120-1 to 120-4 stacked in a first direction D1. The first direction D1 may be a direction forming an acute angle θ1 with respect to a reference direction D0 in which the upper surface of the substrate 100 extends.

A line connecting the first semiconductor chips 120-1 to 120-4 (e.g., connecting centers of the first semiconductor chips 120-1 to 120-4) included in the first semiconductor chip stack 120 may be substantially parallel to, for example, the first direction D1.

The first semiconductor chips 120-1 to 120-4 included in the first semiconductor chip stack 120 may be arranged in a staircase pattern (e.g., a stair-step arrangement). For example, the semiconductor chips 120-1 and 120-2 among the plurality of first semiconductor chips may be stacked with a substantially constant offset in the reference direction D0. As an example, the first semiconductor chips 120-1 to 120-4 may be sequentially arranged with an offset. The reference direction D0 may be, for example, a horizontal direction.

As the first semiconductor chips 120-1 to 120-4 included in the first semiconductor chip stack 120 are arranged in a staircase fashion, a semiconductor chip pad (e.g., a first semiconductor chip pad 151) disposed on each of the first semiconductor chips 120-1 to 120-4 can be sufficiently exposed.

As an example, the first semiconductor chips 120-1 to 120-4 may include a third semiconductor chip 120-1 and a fourth semiconductor chip 120-4 that are sequentially stacked. The fourth semiconductor chip 120-4 may be disposed in the uppermost layer of the first semiconductor chip stack 120.

Each of the first semiconductor chips 120-1 to 120-4 may include the first semiconductor chip pad 151. The first semiconductor chip pad 151 may be disposed on the upper surface adjacent to one side of the semiconductor chip stack. In this case, one side of the semiconductor chip stack may be a side at which a sidewall 120-4S of the fourth semiconductor chip 120-4 is disposed. The fourth semiconductor chip 120-4 may be disposed on the third semiconductor chip 120-1 to expose the first semiconductor chip pad 151 of the third semiconductor chip 120-1.

The first semiconductor chip pad 151 may protrude from the fourth semiconductor chip 120-4. However, exemplary embodiments of the present invention are not limited thereto. For example, a via may be formed instead of the first semiconductor chip pad 151. In this case, the fourth semiconductor chip 120-4 and the substrate 100 may be electrically connected with each other through the via.

A height of the first semiconductor chip stack 120 may be denoted by H1, which may be a height from an upper surface 100u of the substrate 100 to the upper surface of the first semiconductor chip stack 120. The height H1 of the first semiconductor chip stack 120 may be, for example, a height from the upper surface 100u of the substrate 100 to the upper surface of the fourth semiconductor chip 120-4.

The fourth semiconductor chip 120-4 may include a portion 153 which includes a portion to which the first connection 150 is connected. For example, when the first connection 150 is connected to the fourth semiconductor chip 120-4 through the first semiconductor chip pad 151, the portion 153 of the fourth semiconductor chip 120-4 may include the first semiconductor chip pad 151.

The first semiconductor chips 120-1 to 120-4 may include, for example, a NAND flash chips, dynamic random access memory chips (DRAM chips), flash memory chips, or resistance changeable memory chips.

A plurality of first adhesive layers 121 may be disposed between the first semiconductor chips 120-1 to 120-4. Each of the first adhesive layers 121 may be, for example, a direct adhesive film (DAF) or film over wire (FOW). The first adhesive layer 121 may include, for example, an insulating material. The first adhesive layer 121 may insulate the first semiconductor chips 120-1 to 120-4 from each other. The first adhesive layer 121 may insulate, for example, one of the first semiconductor chips 120-1 to 120-4 from the substrate 100.

The first connection 150 may be positioned on one side of the first semiconductor chip stack 120. The first connection 150 may be connected to the first semiconductor chip pad 151 and may electrically connect the fourth semiconductor chip 120-4 with the substrate 100.

The first connection 150 may electrically connect at least one semiconductor chip of the first semiconductor chips 120-1 to 120-4 with the fourth semiconductor chip 120-4. The first connection 150 may electrically connect the fourth semiconductor chip 120-4 with the substrate 100. The first connection 150 may electrically connect the substrate 100 with the fourth semiconductor chip 120-4 through the first upper finger pad 101-1.

The first connection 150 may be, for example, a bonding wire. However, exemplary embodiments of the present invention are not limited thereto. For example, the first connection 150 may be a beam lead, a conductive tape, a conductive spacer, a through electrode, a solder ball, a solder bump, or a combination thereof.

The first support 130 may be disposed on the substrate 100. The first support 130 may be spaced apart from the first semiconductor chip stack 120. The first support 130 may be positioned on an opposite side of the first semiconductor chip stack 120 from the first connection 150. As an example, the opposite side of the first semiconductor chip stack 120 from the first connection 150 may be a side at which the sidewall 140-1S of a fifth semiconductor chip stack 140-1 are positioned.

A height of the first support 130 may be denoted by H2, which may be a height from the upper surface 100u of the substrate 100 to the upper surface of the first support 130. In an exemplary embodiment of the present inventive concept, the height H1 of the first semiconductor chip stack 120 may be equal to the height H2 of the first support 130.

The first support 130 may be arranged on the substrate 100, for example, in a flip-chip manner.

The first support 130 may include, for example, a semiconductor chip 131, a third semiconductor chip pad 133 and the second connection 135. The semiconductor chip 131 of the first support may be, for example, a logic chip such as a controller. The first support 130 may be, for example, a frequency boosting interface (FBI) chip.

The first support 130 may be electrically connected to the substrate 100 through the second connection 135. The second connection 135 may be, for example, a solder ball. For example, the first support 130 may be electrically connected to the substrate 100 by connecting the second upper finger pad 101-2 with the second connection 135. The third semiconductor chip pad 133 may be disposed between the semiconductor chip 131 of the first support 130 and the second connection 135 and may electrically connect the substrate 100 with the semiconductor chip 131 of the first support 130.

Referring to FIG. 2, the first support 130 may control the operations of a plurality of first semiconductor chips 120-1 to 120-4 and a plurality of second semiconductor chips 140-1 to 140-4. For example, the first support 130 may serve as an interface which transmits an input signal to each semiconductor chip by changing the input frequency.

For example, an input signal IN may be transmitted to each of the chips included in the first semiconductor chip stack 120 and/or the second semiconductor chip stack 140 through the first support 130.

However, exemplary embodiments of the present invention are not limited thereto. For example, referring to FIG. 3, the first support 130 may be insulated from the substrate 100 as well as the second semiconductor chip stack 140.

Referring to FIG. 1, the second semiconductor chip stack 140 may be positioned above the substrate 100. The second semiconductor chip stack 140 may be disposed on the first semiconductor chip stack 120 and the first support 130. As an example, the first support 130 may be disposed on the lower surface of the second semiconductor chip stack 140. The first support 130 may support the second semiconductor chip stack 140. As an example, the first support 130 may be disposed on the lower surface of the fifth semiconductor chip stack 140-1.

The second semiconductor chip stack 140 may include the second semiconductor chips 140-1 to 140-4 that are stacked in a second direction D2. The second semiconductor chips 140-1 to 140-4 may be, for example, chips of the same type as the first semiconductor chips 120-1 to 120-4.

The second direction D2 may be a direction intersecting the first direction D1. For example, the second direction D2 may be a direction forming an obtuse angle θ2 with respect to the reference direction D0.

A line connecting the second semiconductor chips 140-1 to 140-4 (e.g., centers of the second semiconductor chips 140-1 to 140-4) included in the second semiconductor chip stack 140 may be substantially parallel to, for example, the second direction D2.

The second semiconductor chips 140-1 to 140-4 included in the second semiconductor chip stack 140 may be arranged in a staircase pattern (e.g., a stair-step arrangement). For example, the semiconductor chips 140-1 and 140-2 among the plurality of second semiconductor chips may be stacked with a substantially constant offset in the reference direction D0. As an example, the second semiconductor chips 140-1 to 140-4 may be sequentially arranged with an offset. The reference direction D0 may be, for example, a horizontal direction.

When the second semiconductor chips 140-1 to 140-4 included in the second semiconductor chip stack 140 are arranged in a staircase fashion, a semiconductor chip pad (e.g., a second semiconductor chip pad 161) disposed on the second semiconductor chips 140-1 to 140-4 may be sufficiently exposed.

As an example, the second semiconductor chips 140-1 to 140-4 may include a fifth semiconductor chip 140-1 and a sixth semiconductor chip 140-4 that are sequentially stacked. The sixth semiconductor chip 140-4 may be disposed in the uppermost layer of the second semiconductor chip stack 140. The fifth semiconductor chip 140-1 may be disposed in the lowermost layer of the second semiconductor chip stack 140.

The second semiconductor chips 140-1 to 140-4 may include a second semiconductor chip pad 161. The second semiconductor chip pad 161 may be disposed on the upper surface adjacent to the other side of the semiconductor chip stack. The sixth semiconductor chip 140-4 may be disposed on the fifth semiconductor chip 140-1 and may expose the second semiconductor chip pad 161 of the fifth semiconductor chip 140-1.

The second semiconductor chip pad 161 may be substantially the same as, for example, the first semiconductor chip pad 151.

In an exemplary embodiment of the present inventive concept, the sixth semiconductor chip 140-4 may expose at least a portion of the fourth semiconductor chip 120-4. For example, the sixth semiconductor chip 140-4 may expose the first semiconductor chip pad 151.

A plurality of second adhesive layers 141 may be disposed between the second semiconductor chips 140-1 to 140-4. The second adhesive layers 141 may be, for example, substantially the same as the first adhesive layers 121. The second adhesive layer 141 may electrically insulate the first support 130 from the fifth semiconductor chip 140-1. As an example, the first support 130 and the fifth semiconductor chip 140-1 may be electrically insulated from each other.

The fifth semiconductor chip 140-1 may be directly connected to the substrate 100 through the third connection 160. In an exemplary embodiment of the present inventive concept, the third connection 160 may be a bonding wire.

In an exemplary embodiment of the present inventive concept, the first support 130 may be bonded to the fifth semiconductor chip 140-1 by the second adhesive layer 141 disposed between the fifth semiconductor chip 140-1 and the first support 130. As an example, the first support 130 and the second adhesive layer 141 may be in direct contact with each other.

In a semiconductor package according to an exemplary embodiment of the present inventive concept, a size of the semiconductor package can be reduced by placing the first support 130 on the lower surface of the second semiconductor chip stack 140. Deflection of the semiconductor chip stack can be prevented by placing the first support 130 on the lower surface of the second semiconductor chip stack 140. The size of the semiconductor package can be reduced by using, as a support, a semiconductor chip serving as a controller for a plurality of semiconductor chips included in the semiconductor chip stack.

In an exemplary embodiment of the present inventive concept, a sidewall 130S of the first support 130 and the sidewall 140-1S of the fifth semiconductor chip 140-1 may be arranged in a substantially straight line. However, exemplary embodiments of the present invention are not limited thereto. For example, referring to FIG. 4, the sidewall 140-1S of the fifth semiconductor chip 140-1 may be more protruded than the sidewall 130S of the first support 130 in the reference direction D0.

Referring to FIG. 1, each of the first semiconductor chip stack 120 and the second semiconductor chip stack 140 may include four semiconductor chips; however, exemplary embodiments of the present invention are not limited thereto. For example, referring to FIG. 5, each of the first semiconductor chip stack 120 and the second semiconductor chip stack 140 may include eight semiconductor chips (e.g., semiconductor chips 120-1 to 120-8 and 140-1 to 140-8).

The height H1 from the upper surface 100$u$ of the substrate 100 to the upper surface of the first semiconductor chip stack 120 may be substantially equal to the height H2 from the upper surface 100$u$ of the substrate 100 to the upper surface of the first support 130.

Referring to FIG. 1, a molding film 170 may be disposed on the first semiconductor chip stack 120, the second semiconductor chip stack 140, and the first support 130. The molding film 170 may include, for example, by curing epoxy molding compound (EMC). The molding film 170 may protect the first semiconductor chip stack 120, the second semiconductor chip stack 140, and the first support 130 from an external environment such as from moisture or a physical impact.

Referring to FIG. 6, a second support 190 may be disposed on the substrate 100.

The second support 190 may be spaced apart from the first support 130 and the first semiconductor chip stack 120. Similarly to the first support 130, the second support 190 may be in direct contact with the lower surface of the second semiconductor chip stack 140. As an example, the second support 190 may be in direct contact with the lower surface of the fifth semiconductor chip 140-1.

Similarly to the first support 130, the second support 190 may be a FBI chip which may be electrically connected to the substrate 100. Alternatively, the second support 190 may be, for example, a support which is electrically insulated from the substrate 100.

Similarly to the first support 130, the second support 190 may be electrically insulated from the fifth semiconductor chip 140-1. For example, the second support 190 may be electrically insulated from the fifth semiconductor chip 140-1 by the second adhesive layer 141 disposed between the fifth semiconductor chip 140-1 and the second support 190.

In an exemplary embodiment of the present inventive concept, the second support 190 may be bonded to the fifth semiconductor chip 140-1 by the second adhesive layer 141 disposed between the fifth semiconductor chip 140-1 and the second support 190. As an example, the second support 190 and the second adhesive layer 141 may be, for example, in direct contact with each other.

The height of the second support 190 may be, for example, substantially equal to the height H2 of the first support 130.

The second support 190 may be mounted on the substrate 100, for example, in a flip-chip manner.

The second support 190 may be substantially the same as the first support 130; however, exemplary embodiments of the present inventive concept are not limited thereto. In an exemplary embodiment of the present inventive concept, the second support 190 may include a semiconductor chip 191, a fourth semiconductor chip pad 193 and a fourth connection 195. The second support 190 may be electrically connected to the substrate 100 through the fourth connection 195.

The first support 130 and the second support 190 may be in direct contact with the lower surface of the fifth semiconductor chip 140-1 of the second semiconductor chip stack 140, for example, in an overhang structure of the semiconductor package to support the second semiconductor chip stack 140.

The second support 190 and the first support 130 may be arranged side by side; however, exemplary embodiments of the present inventive concept are not limited thereto. For example, in the overhang structure of the semiconductor package, if the first support 130 and the second support 190 can support the semiconductor chip (e.g., the fifth semiconductor chip 140-1) of the lowermost layer of the second semiconductor chip stack 140, the first support 130 and the second support 190 need not be arranged side by side.

A semiconductor package according to an exemplary embodiment of the present inventive concept will be described in more detail below with reference to FIGS. 1, 7 and 8. Technical features which are the same as those described above might not be described again, and thus duplicative descriptions may be omitted.

Figure 7:
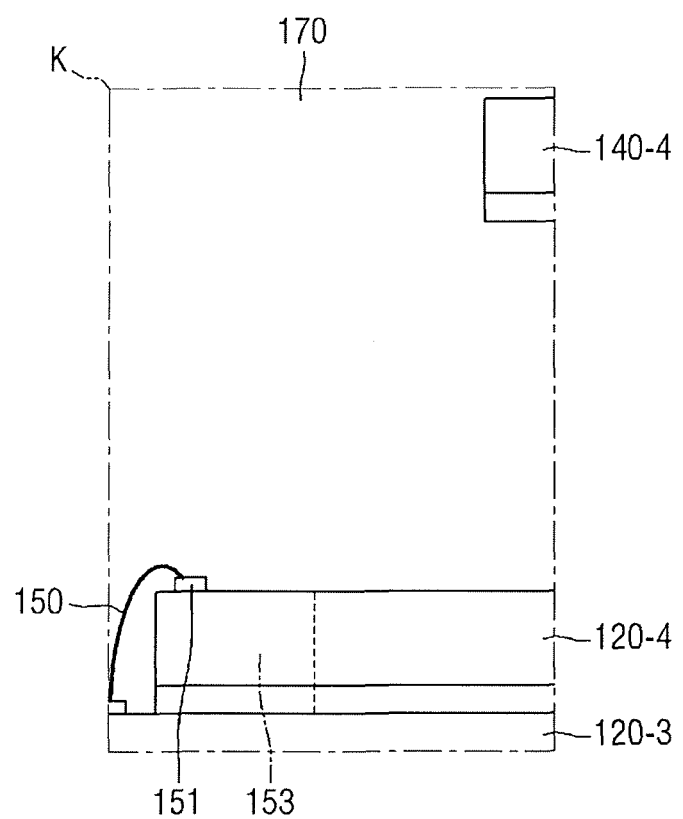
FIG. 7 is an enlarged view of a region K of FIG. 1.

FIG. 7 is an enlarged view of a region K of FIG. 1. FIG. 8 is a top view of FIG. 1.

Figure 8:
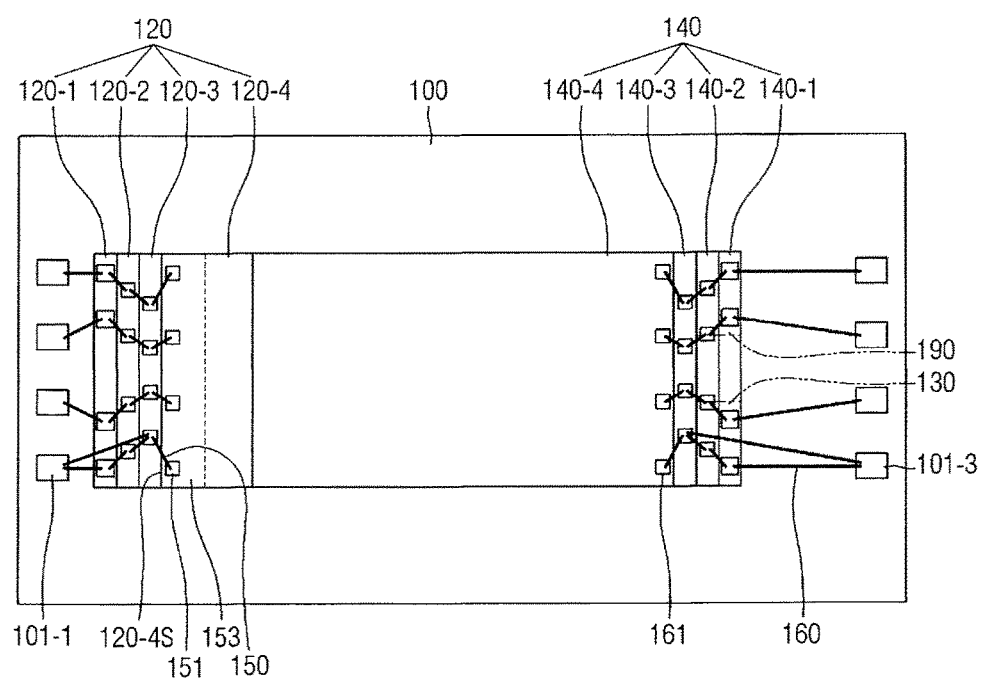
FIG. 8 is a top view of FIG. 1.

Referring to FIGS. 1, 7 and 8, the portion 153 of the fourth semiconductor chip 120-4 need not overlap the sixth semiconductor chip 140-4 in a vertical direction with respect to an upper surface of the substrate 100.

As an example, referring to FIG. 8, since the portion 153 of the fourth semiconductor chip 120-4 need not overlap the sixth semiconductor chip 140-4, the first semiconductor chip pad 151 may be exposed.

In the semiconductor package according to an exemplary embodiment of the present inventive concept, the sixth semiconductor chip 140-4 disposed in the uppermost layer of the second semiconductor chip stack 140 may expose the first semiconductor chip pad 151 of the fourth semiconductor chip 120-4 disposed in the uppermost layer of the first semiconductor chip stack 120. Thus, wire bonding can be performed substantially simultaneously on the first semiconductor chip stack 120 and the second semiconductor chip stack 140. The first semiconductor chip pad 151 may be disposed on the upper surface adjacent to one side of the semiconductor chip stack.

In the semiconductor package according to an exemplary embodiment of the present inventive concept, the portion 153 of the first semiconductor chip stack 120 need not overlap the sixth semiconductor chip 140-4 of the second semiconductor chip stack 140 in the vertical direction. Thus, wire bonding can be performed substantially simultaneously on the first semiconductor chip stack 120 and the second semiconductor chip stack 140. As an example, the first connection 150 and the third connection 160 may be formed substantially simultaneously. Thus, according to an exemplary embodiment of the present inventive concept, a semiconductor package manufacturing process can be simplified.

The portion 153 of the fourth semiconductor chip 120-4 may include a portion to which a plurality of connections are connected. The portion 153 of the fourth semiconductor chip 120-4 may include, for example, a plurality of semiconductor chip pads.

A semiconductor package according to an exemplary embodiment of the present inventive concept will be described in more detail below with reference to FIGS. 1 and 9. Technical features which are the same as those described above might not be described again, and thus duplicative descriptions may be omitted.

Figure 9:
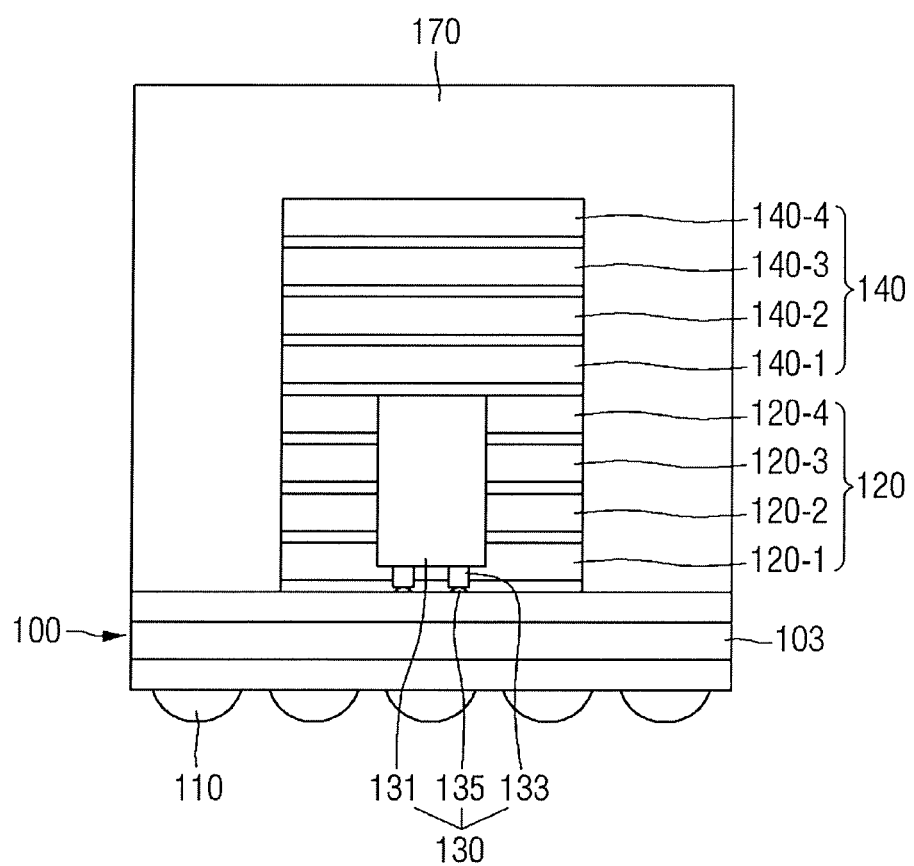
FIG. 9 is a side view of FIG. 1.

FIG. 9 is a side view of FIG. 1.

Referring to FIGS. 1 and 9, a semiconductor package according to an exemplary embodiment of the present inventive concept may include only the first support 130.

The semiconductor package according to an exemplary embodiment of the present inventive concept may include only one support that can support the second semiconductor chip stack 140. However, exemplary embodiments of the present inventive concept are not limited thereto. For example, the semiconductor package according to an exemplary embodiment of the present inventive concept may include three or more supports.

The first support 130 may be disposed on the lower surface of the center of the fifth semiconductor chip 140-1; however, exemplary embodiments of the present inventive concept are not limited thereto. The first support 130 may be disposed at a different position that can support the second semiconductor chip stack 140.

A method for fabricating a semiconductor package according to an exemplary embodiment of the present inventive concept will be described in more detail below with reference to FIGS. 1 and 10 to 13. Technical features which are the same as those described above might not be described again, and thus duplicative descriptions may be omitted.

FIGS. 10 to 13 illustrate a method for fabricating a semiconductor package according to an exemplary embodiment of the present inventive concept.

Figure 10:
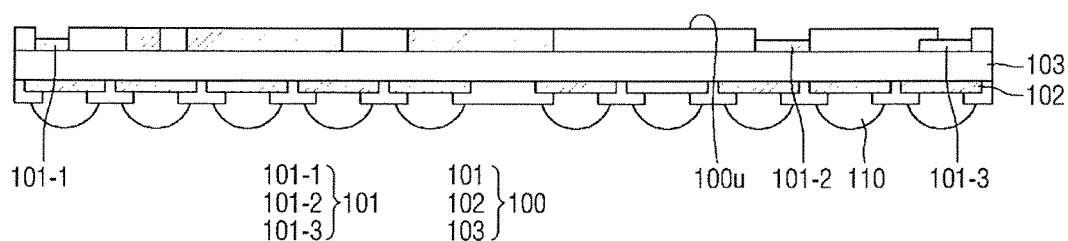
FIGS. 10 to 13 illustrate a method for fabricating a semiconductor package according to an exemplary embodiment of the present inventive concept.

Referring to FIG. 10, the external terminal 110 may be formed on the lower surface of the substrate 100. The substrate 100 may include the upper finger pad 101 formed on the upper surface of the core board 103 and the lower finger pad 102 formed on the lower surface of the core board 103.

Figure 11:
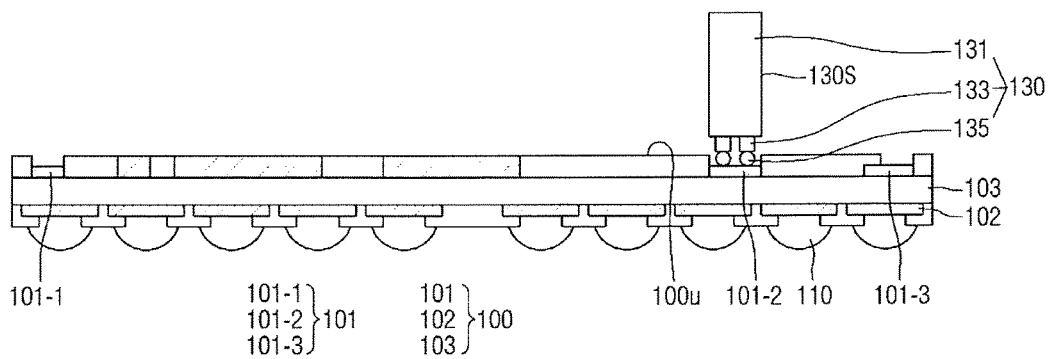

Referring to FIG. 11, the first support 130 may be formed on the substrate 100. The first support 130 may be mounted on the substrate 100, for example, in a flip-chip manner. The first support 130 may be connected to the substrate 100 through the second connection 135. As an example, the first support 130 may be formed on the second upper finger pad 101-2 of the substrate 100.

In an exemplary embodiment of the present inventive concept, the first support 130 and the second support 190 may be formed such that the first support 130 and the first semiconductor chip stack 120 are spaced apart from each other on the substrate 100.

Figure 12:
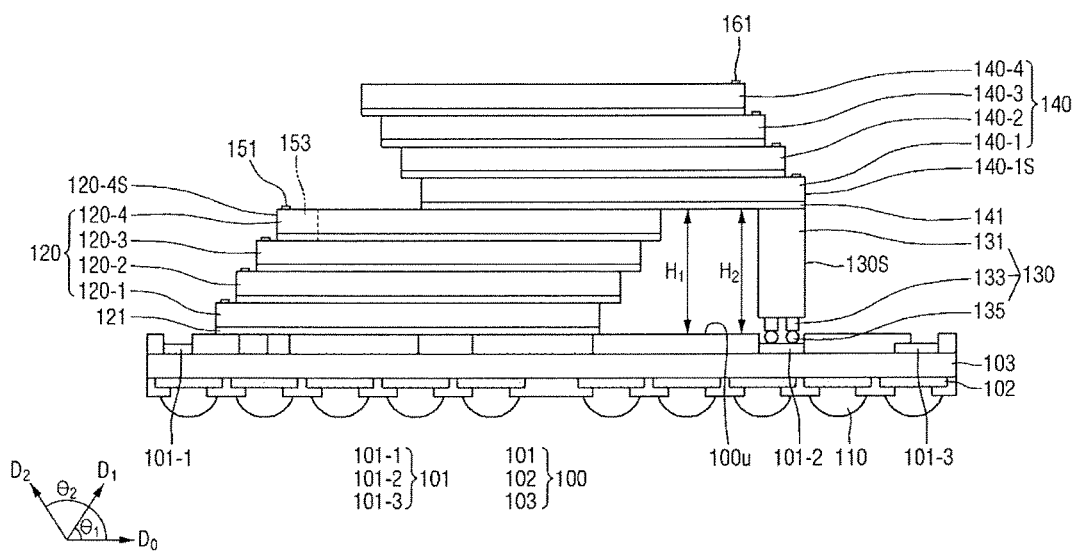

Referring to FIG. 12, the semiconductor chip stack may be formed on the substrate 100. The semiconductor chip stack may include the first semiconductor chip stack 120 and the second semiconductor chip stack 140. The first semiconductor chip stack 120 and the second semiconductor chip stack 140 may be formed, for example, substantially simultaneously on the substrate 100.

The first semiconductor chip stack 120 may be disposed on the substrate 100 and may be spaced apart from the first support 130. The second semiconductor chip stack 140 may be disposed on the first semiconductor chip stack 120 and the first support 130. In an exemplary embodiment of the present inventive concept, the first support 130 may be in direct contact with the second adhesive layer 141 disposed between the first support 130 and the fifth semiconductor chip 140-1. The fifth semiconductor chip 140-1 may be a chip of the lowermost layer of the second semiconductor chip stack 140.

When the second support 190 is formed on the substrate 100, the second semiconductor chip stack 140 may be disposed on the second support 190 as well as the first semiconductor chip stack 120 and the first support 130.

After the semiconductor chip stack is formed on the substrate 100, the first semiconductor chip pad 151 may be formed on a first side of the semiconductor chip stack. The second semiconductor chip pad 161 may be formed on a second side of the semiconductor chip stack opposite the first side. However, exemplary embodiments of the present inventive concept are not limited thereto. As an example, the first and second semiconductor chip pads 151 and 161 may be formed on the first semiconductor chip stack 120 and the second semiconductor chip stack 140, respectively, before the semiconductor chip stacks are formed on the substrate 100.

Figure 13:
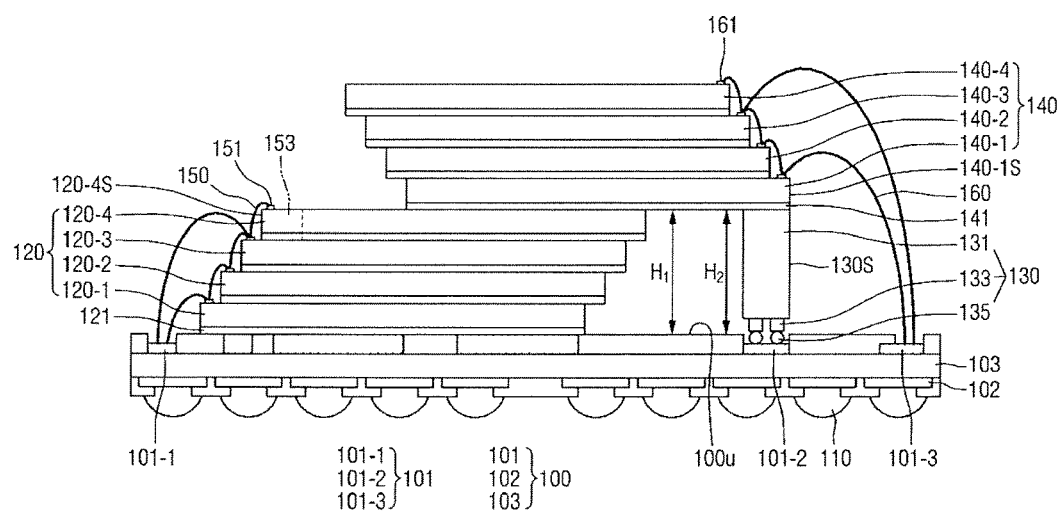

Referring to FIG. 13, the first connection 150 and the third connection 160 may be formed substantially simultaneously.

The first connection 150 may be formed on a first side of the semiconductor chip stack. The first connection 150 may electrically connect the first semiconductor chip stack 120 with the substrate 100. The third connection 160 may be formed on a second side of the semiconductor chip stack opposite the first side. The third connection 160 may electrically connect the second semiconductor chip stack 140 with the substrate 100.

In a method for fabricating a semiconductor package according to an exemplary embodiment of the present inventive concept, the first support 130 may be formed below the fifth semiconductor chip 140-1 and may be spaced apart from the first semiconductor chip stack 120. Thus, the first connection 150 and the third connection 160 can be formed substantially simultaneously. Thus, a method for fabricating a semiconductor package according to an exemplary embodiment of the present inventive concept may be simplified.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A semiconductor package comprising:
   a substrate;
   a first semiconductor chip stack disposed on the substrate, wherein the first semiconductor chip stack includes a plurality of first semiconductor chips, wherein the first semiconductor chips are stacked in a first staircase configuration along a first direction;
   a first support disposed on the substrate, wherein the first support is spaced apart from the first semiconductor chip stack; and
   a second semiconductor chip stack disposed on the first semiconductor chip stack and the first support, wherein the second semiconductor chip stack includes a plurality of second semiconductor chips, wherein the second semiconductor chips are stacked in a second staircase configuration along a second direction opposite the first direction,
   wherein a height of the first semiconductor chip stack is substantially equal to a height of the first support, and
   wherein the first support is mounted in a flip chip manner.

2. The semiconductor package of claim 1, wherein a third semiconductor chip is disposed in the uppermost layer of the plurality of first semiconductor chips,
   a fourth semiconductor chip is disposed in the uppermost layer of the plurality of second semiconductor chips, and
   the fourth semiconductor chip is spaced apart from at least a portion of the third semiconductor chip along a direction orthogonal to an upper surface of the third semiconductor chip.

3. The semiconductor package of claim 2, wherein the fourth semiconductor chip is spaced apart from a semiconductor chip pad disposed on the third semiconductor chip along the direction orthogonal to the upper surface of the third semiconductor chip, and wherein the semiconductor chip pad electrically connects the third semiconductor chip with the substrate.

4. The semiconductor package of claim 2, wherein the third semiconductor chip is an uppermost semiconductor chip of the plurality of first semiconductor chips.

5. The semiconductor package of claim 1, wherein
   the first support is disposed on a bottom surface of the second semiconductor chip stack facing the substrate, and
   a lowermost semiconductor chip of the second semiconductor chip stack is connected to the substrate by a bonding wire.

6. The semiconductor package of claim 1, wherein
   the first support is disposed on a bottom surface of the second semiconductor chip stack facing the substrate,
   the first support is electrically connected to a lowermost semiconductor chip of the second semiconductor chip stack, and
   the first support and the substrate are electrically connected to each other.

7. The semiconductor package of claim 6, wherein the first support is a frequency boosting interface (FBI).

8. The semiconductor package of claim 6, wherein
   the first support is in direct contact with an adhesive layer disposed on the bottom surface of the second semiconductor chi stack facing the substrate.

9. The semiconductor package of claim 1, further comprising a second support disposed on the substrate, wherein the second support is spaced apart from the first support and the first semiconductor chip stack along the first direction,
   wherein the second semiconductor chip stack is disposed on the first semiconductor chip stack, the first support and the second support.

10. The semiconductor package of claim 1, wherein the first direction forms an acute angle with an upper surface of the substrate, and wherein the second direction forms an obtuse angle with the upper surface of the substrate.

11. A semiconductor package comprising:
    a substrate;
    a first semiconductor chip stack disposed on the substrate, wherein the first semiconductor chip stack includes first and second semiconductor chips stacked sequentially;
    a second semiconductor chip stack, wherein a first portion of the second semiconductor chip stack is disposed on the first semiconductor chip stack, and a second portion of the second semiconductor chip stack not disposed on the first semiconductor chip stack overhangs the substrate, and wherein the second semiconductor chip stack includes third and fourth semiconductor chips stacked sequentially; and
    a support supporting the second portion of the second semiconductor chip stack overhanging the substrate,
    wherein each of the first and second semiconductor chips includes a first semiconductor chip pad disposed on an upper surface of each of the first and second semiconductor chips adjacent to a first side of the first semiconductor chip stack,
    wherein each of the third and fourth semiconductor chips includes a second semiconductor chip pad disposed on an upper surface of each of the third and fourth semiconductor chips adjacent to a second side of the second semiconductor chip stack opposite the first side of the first semiconductor chip stack,
    wherein the second semiconductor chip is disposed on the first semiconductor chip to expose the first semiconductor chip a of the first semiconductor chip,
    wherein the fourth semiconductor chip is disposed on the third semiconductor chip to expose the second semiconductor chip pad of the third semiconductor chip, and
    wherein the third and fourth semiconductor chips expose the first semiconductor chip pad on the second semiconductor chip.

12. The semiconductor package of claim 11, wherein the support is electrically connected to the substrate, and wherein the support is electrically insulated from the second semiconductor chip stack.

13. The semiconductor package of claim 12, wherein the support is a frequency boosting interface (FBI).

14. The semiconductor package of claim 11, wherein the third semiconductor chip is connected to the substrate by a bonding wire connected to the second semiconductor chip pad of the third semiconductor chip.

15. A semiconductor package, comprising:
- a substrate;
- a first semiconductor chip stack comprising a plurality of first semiconductor chips arranged in a staircase configuration along a first direction, wherein an upper surface of an uppermost one of the first semiconductor chips comprises a first semiconductor chip pad, and wherein the first semiconductor chip pad is electrically connected to a first upper finger pad disposed on the substrate;
- a second semiconductor chip stack comprising a plurality of second semiconductor chips arranged in a staircase configuration along a second direction opposite the first direction, wherein a first portion of the second semiconductor chip stack is disposed on the upper surface of the uppermost one of the first semiconductor chips, wherein a second portion of the second semiconductor chip stack overhangs the substrate, wherein an upper surface of an uppermost one of the second semiconductor chips comprises a second semiconductor chip pad, and wherein the second semiconductor chip pad is electrically connected to a second upper finger pad disposed on the substrate; and
- a support supporting the second portion of the second semiconductor chip stack overhanging the substrate, wherein the first portion of the second semiconductor chip stack is spaced apart from the first semiconductor chip pad.

16. The semiconductor package of claim 15, wherein the support is a frequency boosting interface (FBI).

17. The semiconductor package of claim 15, wherein a lowermost one of the second semiconductor chips comprises an adhesive layer, and wherein the adhesive layer insulates an upper surface of the support from the lowermost one of the second semiconductor chips.

18. The semiconductor package of claim 15, wherein the first and second semiconductor chip pads are connected to the first and second upper finger pads, respectively, by a bonding wire.

19. The semiconductor package of claim 15, wherein the support is electrically connected to a third upper finger pad disposed on the substrate.

* * * * *